(12) United States Patent
Haggay et al.

(10) Patent No.: US 7,077,710 B2
(45) Date of Patent: Jul. 18, 2006

(54) PATCH PANEL

(75) Inventors: Yaakov Haggay, Kfar Saba (IL);
Pinhas Shifris, Tel Aviv (IL)

(73) Assignee: RIT Technologies Ltd., Tel Aviv (IL)

( * ) Notice: Subject to any disclaimer, the term of this patent is extended or adjusted under 35 U.S.C. 154(b) by 0 days.

(21) Appl. No.: 10/472,720

(22) PCT Filed: Mar. 4, 2002

(86) PCT No.: PCT/IL02/00164

§ 371 (c)(1),
(2), (4) Date: Feb. 27, 2004

(87) PCT Pub. No.: WO02/075869

PCT Pub. Date: Sep. 26, 2002

(65) Prior Publication Data

US 2004/0132348 A1    Jul. 8, 2004

Related U.S. Application Data

(63) Continuation-in-part of application No. PCT/IL02/00164, filed on Mar. 4, 2002.

(30) Foreign Application Priority Data

Mar. 21, 2001   (IL) ...................................... 142157

(51) Int. Cl.
*H01R 9/22* (2006.01)
(52) U.S. Cl. .................................................... 439/719
(58) Field of Classification Search ................ 439/713, 439/49, 540.1, 545.1, 610; 385/134, 135
See application file for complete search history.

(56) References Cited

U.S. PATENT DOCUMENTS

| | | | |
|---|---|---|---|
| 4,861,287 A | | 8/1989 | Bevacqua |
| 4,878,847 A | | 11/1989 | Rutledge |
| 5,353,367 A | * | 10/1994 | Czosnowski et al. ........ 385/135 |
| 5,385,488 A | * | 1/1995 | Clark .......................... 439/557 |
| 5,492,478 A | * | 2/1996 | White ......................... 439/76.1 |
| 5,548,489 A | * | 8/1996 | Reed et al. .................. 439/729 |
| 5,800,215 A | | 9/1998 | Dohnke |
| 5,946,440 A | * | 8/1999 | Puetz .......................... 385/135 |
| 6,074,251 A | * | 6/2000 | Edgerly et al. ............. 439/610 |
| 6,120,322 A | | 9/2000 | Ho et al. |
| 6,123,577 A | * | 9/2000 | Contois et al. ............. 439/676 |
| 6,343,950 B1 | * | 2/2002 | Eginton et al. .......... 439/540.1 |
| 6,504,725 B1 | | 1/2003 | Lam |
| 6,504,986 B1 | * | 1/2003 | Wambeke et al. .......... 385/134 |

FOREIGN PATENT DOCUMENTS

| | | |
|---|---|---|
| DE | 2048104 | 4/1972 |
| EP | 524115 | 1/1993 |
| EP | 575100 | 12/1993 |

(Continued)

*Primary Examiner*—Briggitte R. Hammond
(74) *Attorney, Agent, or Firm*—Pearl Cohen Zedek Latzer LLP

(57) ABSTRACT

A stacked patch panel comprising two plates, such as printed circuit board, each provided with cable connectors and a separate supporting plate, made of rigid material, such as metal. The upper portion of the cable connectors of the lower plate lie in a plane adjacent to or below that of the bottom portion of the upper plate. The panel is also provided with means to anchor the cables and with means to hold the plates in relative alignment and to attach them to a supporting rack.

13 Claims, 3 Drawing Sheets

FOREIGN PATENT DOCUMENTS

| | | |
|---|---|---|
| EP | 1066741 | 1/2001 |
| FR | 2641154 | 6/1990 |
| WO | WO 98/35409 | 8/1998 |
| WO | WO 98/57398 | 12/1998 |

* cited by examiner

PATCH PANEL

The present application is a continuation-in-part application of PCT Application PCT/IL02/00164, filed Mar. 4, 2002, which claims priority from Israeli patent application IL 142157, filed Mar. 21, 2001.

FIELD OF THE INVENTION

The present invention relates to the field of electrical signal connections for computer networks. More specifically the invention relates to an improvement over existing designs of patch panels.

BACKGROUND OF THE INVENTION

Local area computer networks (LANS) used today in governmental and private office buildings, educational institutions, banks, etc. consist of a central network equipment, such as a hub or switch, connected to a large number varying from tens to thousands of personal computers, or workstations, that are widely spread within the office, building, or even at much more remotely located locations. All users of the LAN are connected to each other and to the central computing and memory storage of the system by either copper or fiber optic cables. The function of the patch panel is to assist in making fast and simple changes in the interconnections of the multitude of patch cords and cables in the system between users and network equipment.

It is a purpose of this invention to provide a patch panel that overcomes the limitation of the prior art by doubling the number of connection that can be made in the same amount of space occupied by existing patch panels of standard dimensions according to the EIA RS 310-C Standard (November 1977).

It is another purpose of the present invention to provide a patch panel in which the PCB plates be easily removed for maintenance.

SUMMARY OF THE INVENTION

The present invention is directed towards a stacked patch panel comprising two plates each provided with cable connectors and a separate supporting plate, wherein the upper portion of the cable connectors of the lower plate lie in a plane adjacent or below that of the bottom portion of the upper plate. The panel being further provided with means to anchor the cables and with means to hold the plates in relative alignment and to attach them to a supporting rack.

In one embodiment of the invention each of the two plates is a printed circuit board and the supporting plates are made of rigid material such steel, other metals, plastic materials, etc. The cable connectors are standard connectors for copper or optical fiber cables.

All the above and other characteristics and advantages of the invention will be further understood through the following illustrative and non-limitative description of several embodiments thereof, with reference to the appended drawings.

BRIEF DESCRIPTION OF THE DRAWINGS

Other advantages of the present invention will be readily appreciated as the same becomes better understood by reference to the following detailed description when considered in connection with the accompanying drawings wherein.

DETAILED DESCRIPTION OF INVENTION

Figure 1:
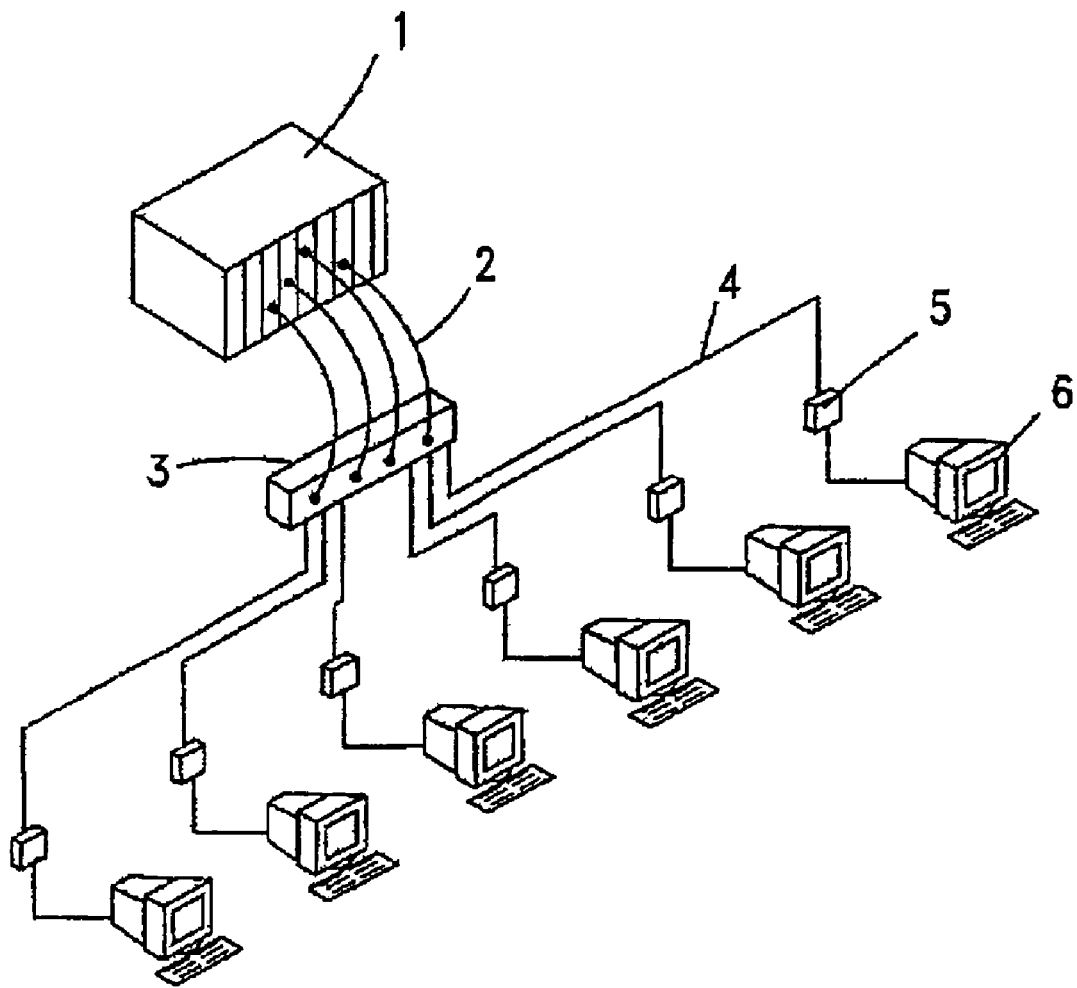
FIG. 1 is a schematic drawing of the user side of a typical LAN.

FIG. 1 schematically shows the main elements of the user side of a typical local area network (LAN). Patch cords 2 connect between the hub or switch 1 and the patch panel 3. From the patch panel, cables 4 conduct the signals to and from the individual workstations 6 through the communication outlets 5.

Figure 2:
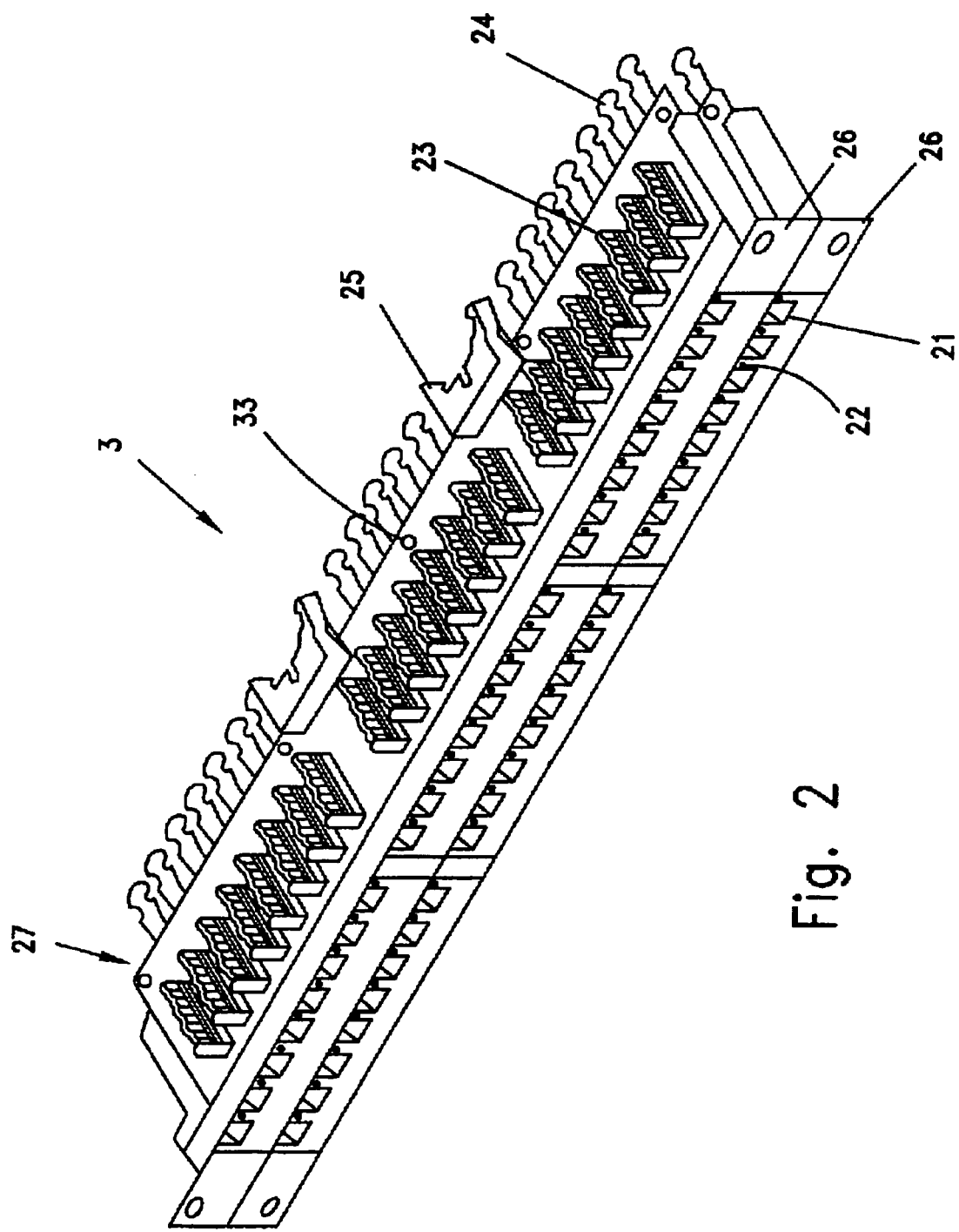
FIG. 2 is a perspective view showing the front, side, and top of the patch panel of the invention.
Figure 3:
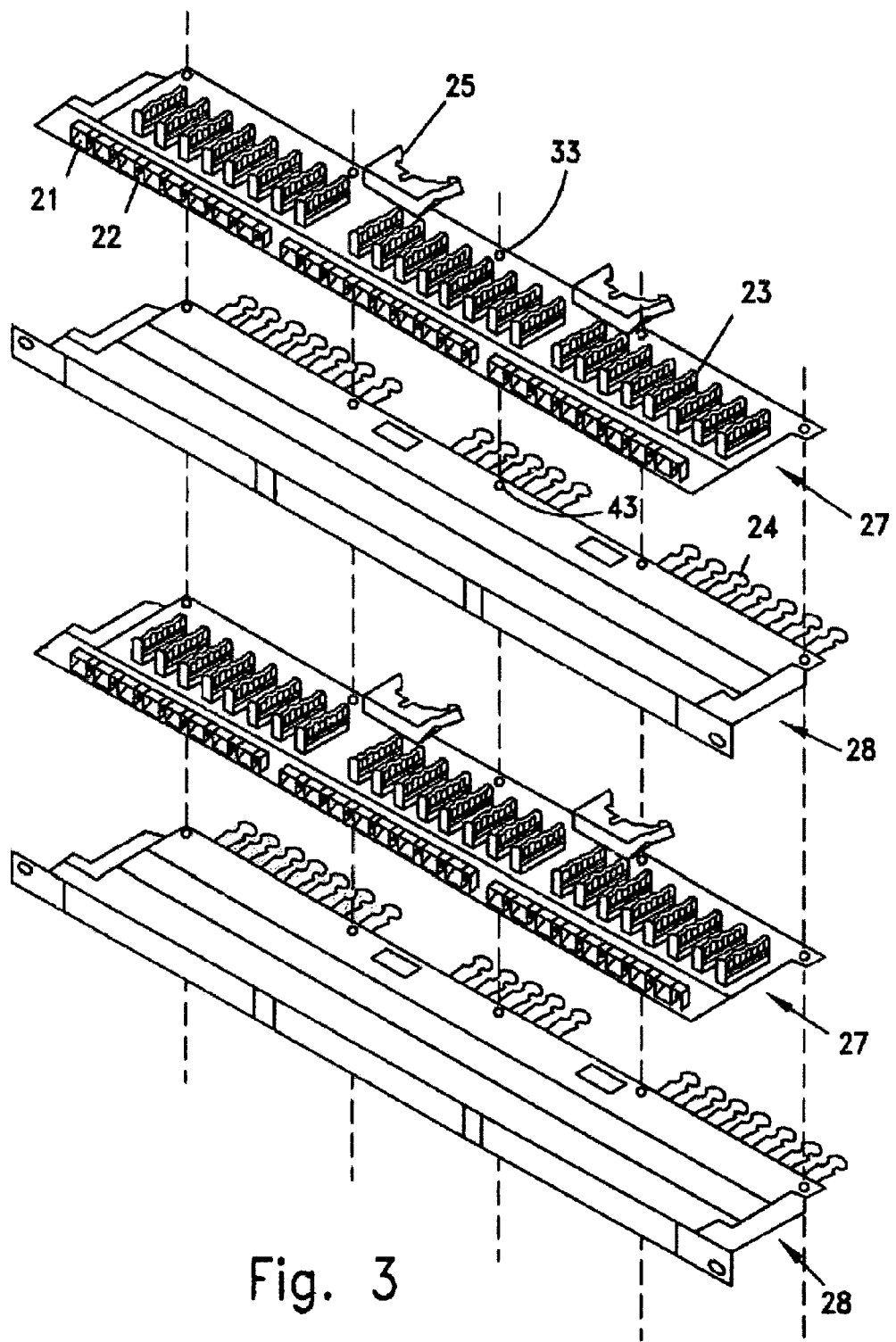
FIG. 3 is an exploded view showing the plates that make up the patch panel of FIG. 2.

FIGS. 2 and 3 show the main features of the device of the invention, which is generally designated by numeral 3 in FIG. 2. As shown in the exploded view of FIG. 3, the patch panel of the invention is made up of four separate plates. The two plates, designated by numeral 28 in FIG. 3, are made of a suitable rigid material, for example steel or plastic material, and are used to support the other two plates and attached cables.

The two plates designated by numeral 27 in FIGS. 2 and 3 are Printed Circuit Boards that provide the electrical continuity between the "front" 21 and "back" 23 connector devices, that are mounted on the top of the board. The front side connectors 21 connect to the patch cords (FIG. 1) and are standard connectors, for example RJ45 jacks. The cables 4 (FIG. 1) connect to connector devices 23, which can be any suitable device such as 110 connection modules or Krone modules. The above examples are suitable for the case of copper cables; but, as will be understood by the skilled person, standard connectors are provided in other embodiments of the invention for connecting optical fibers.

The two supporting plates 28 are not present in conventional patch panels which typically comprise only one such plate because of the requirements of maintenance and installation that typically require more space. In the present invention, the basic building block consists of the stacked arrangement shown in FIG. 2. By proper choice of the connector devices and the insertion of plates 28 between the circuit boards, the plates can be placed one upon the other and, in the particular illustrated embodiment of the invention shown in the figures, it is such that the top plate is supported by the connector devices of the bottom plate. However, other arrangements can be provided, which do not require support by the connectors.

The plates 27 and 28 may include bores 33 and 43 at the back side of each plate. All panels bores 33 and 43, of the plates 27 and 28, are essentially aligned when they are placed one upon the other, that can be used to hold the plates in relative alignment and prevent displacements by utilizing vertical mounting elements. This arrangement of the invention is particularly beneficial for maintenance since the PCB plates 27 can be easily released and removed from the panel by removing the vertical mounting elements.

It has been found that creating this stacked arrangement leads to no undesirable effects or deterioration of electrical performance over conventional patch panels. By means of this arrangement, twice as many connection points are made available per unit height. The unit height, one standard Unit (1U) is defined according to the EIA RS 310-C Standard (November 1977).

Numeral 24 designates anchoring points that are an integral part of plates 28. The function of these anchoring points is to assist with the task of cable routing and to provide a place for clamping or tying down the cables (strain relief feature). Numeral 26 designates rack-mounting ears which are designed to hold the two portions of the panel on a conventional rack.

Numeral 22 designates a LED that is associated with each of the connector devices 21. Two 26-pin connectors, designated by numeral 25, are provided on each circuit board 27. The connectors 25 and LEDs 22 are optional devices not relevant to the present invention, but are parts of a system (described in U.S. Pat. No. 5,483,467 by the same applicant) used to manage the network cable connections.

Although embodiments of the invention have been described by way of illustration, it will be understood that the invention may be carried out with many variations, modifications, and adaptations, without departing from its spirit or exceeding the scope of the claims.

Obviously, many modifications and variations of the present invention are possible in light of the above teachings. The invention may be practiced otherwise than as specifically described within the scope of the appended claims.

What is claimed is:

1. A one-unit (1U) stacked patch panel comprising:
   a lower portion having a first group of front-side cable connectors arranged in a lower row and back connectors arranged in a row adjacent to said lower row, wherein said lower portion comprises a carrying plate to hold said first group of front-side cable connectors and back connectors and a support plate below said carrying plate; and
   an upper portion stacked above said lower portion, said upper portion having a second group of front-side cable connectors arranged in an upper row above said lower row and back connectors arranged in a row adjacent to said upper row, wherein said patch panel has a vertical height of one standard Unit (1U).

2. The patch panel of claim 1, wherein said carrying plate is a printed circuit board.

3. The patch panel of claim 1, wherein said front-side cable connectors are RJ45 jacks.

4. The patch panel of claim 1, wherein said lower portion comprises 24 cable connectors.

5. The patch panel of claim 1, wherein said lower portion has a height of substantially half standard Unit.

6. The patch panel of claim 1, wherein said upper portion comprises 24 cable connectors.

7. The patch panel of claim 1, wherein said upper portion has a height of substantially half standard Unit.

8. The patch panel of claim 1, wherein said support plate is made of a rigid material.

9. The patch panel of claim 8 wherein the rigid material is a metal.

10. The patch panel of claim 1, wherein said upper portion comprises a carrying plate to hold said second group of front-side cable connectors and back connectors and a support plate below said carrying plate.

11. The patch panel of claim 10, wherein said carrying plate is a printed circuit board.

12. The patch panel of claim 10, wherein said back connectors are 110 connection modules or Krone modules.

13. The patch panel of claim 10, wherein said support plate is made of a metal.

* * * * *